US008090896B2

(12) United States Patent
Nieminen

(10) Patent No.: US 8,090,896 B2
(45) Date of Patent: Jan. 3, 2012

(54) ADDRESS GENERATION FOR MULTIPLE ACCESS OF MEMORY

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 850 days.

(21) Appl. No.: 12/217,333

(22) Filed: Jul. 3, 2008

(65) Prior Publication Data
US 2010/0005221 A1    Jan. 7, 2010

(51) Int. Cl.
*G06F 12/00* (2006.01)
(52) U.S. Cl. .................. 711/5; 711/E12.081
(58) Field of Classification Search .................. None
See application file for complete search history.

(56) References Cited

U.S. PATENT DOCUMENTS

| | | | |
|---|---|---|---|
| 5,081,575 A | 1/1992 | Hiller et al. | 395/325 |
| 5,938,790 A | 8/1999 | Marrow | 714/795 |
| 6,205,533 B1 * | 3/2001 | Margolus | 712/13 |
| 6,654,927 B1 | 11/2003 | Sall et al. | 714/786 |
| 6,888,901 B2 | 5/2005 | Yu et al. | 375/341 |
| 6,898,254 B2 | 5/2005 | Wolf et al. | 375/340 |
| 6,904,555 B2 | 6/2005 | Nagase et al. | 714/751 |
| 6,950,977 B2 | 9/2005 | Lavi et al. | 714/794 |
| 6,988,233 B2 | 1/2006 | Kanai et al. | 714/755 |
| 7,272,771 B2 | 9/2007 | Nieminen | 714/755 |
| 2007/0234180 A1 | 10/2007 | Edmonston et al. | 714/759 |
| 2008/0301383 A1 | 12/2008 | Nieminen | 711/157 |

FOREIGN PATENT DOCUMENTS
WO    WO 95/17787    6/1995

OTHER PUBLICATIONS

"Mapping Interleaving Laws to Parallel Turbo and LDPC Decoder Architectures", Alberto Tarable et al., IEEE Transactions on Information Theory, vol. 50, No. 9, Sep. 2004, pp. 2002-2009.
"Mapping Interleaving Laws to Parallel Turbo Decoder Architectures", Alberto Tarable, et al., IEEE Communciations Letters, vol. 8, No. 3, Mar. 2004, pp. 162-164.
"A network-oriented inter-block permutation to enhance Rel'6 turbo coding throughput", HighDimension Ltd., 3GPP TSG RAN WG1#46, R1-062153, Sep. 2006, pp. 1-10.

(Continued)

Primary Examiner — Reginald Bragdon
Assistant Examiner — Aracelis Ruiz
(74) Attorney, Agent, or Firm — Harrington & Smith

(57) ABSTRACT

A memory bank has a plurality of memories. In an embodiment, a forward unit applies logical memory addresses to the memory bank in a forward twofold access order, a backward unit applies logical memory addresses to the memory bank in a backward twofold access order, and a half butterfly network (at least half, and barrel shifters in 8-tuple embodiments) is disposed between the memory bank and the forward unit and the backward unit. A set of control signals is generated which are applied to the half or more butterfly network (and to the barrel shifters where present) so as to access the memory bank with an n-tuple parallelism in a linear order in a first instance, and a quadratic polynomial order in a second instance, where n=2, 4, 8, 16, 32, . . . . This access is for any n-tuple of the logical addresses, and is without memory access conflict. In this manner memory access may be controlled data decoding.

33 Claims, 6 Drawing Sheets

OTHER PUBLICATIONS

"A low power implementation-oriented turbo coding interleaver", ITRI, 3GPP TSG RAN WG1 Meeting #47, R1-063455, Nov. 2006, pp. 1-16.

"A Contention-Free Memory Mapping for ARP interleavered Turbo Codes of Arbitrary Sizes", Broadcom, 3GPP TSG RAN WG1 #47, R1-063243, Nov. 2006, pp. 1-11.

"IBP interleaver for turbo coding and shortening position assigning algorithm", ITRI, 3GPP TSG RAN WG1 Meeting #47, R1-070112, Jan. 2007, pp. 1-14.

"Flexible and Formulaic Collision-free Memory Accessing for Parallel Turbo decoding with Quadratic polynomial permutation (QPP) Interleave", Broadcom, 3GPP TSG RAN WG1 #47 BIZ, R1-070618, Jan. 2007, pp. 1-5.

"Approved Report of 3GPP TSG RAN WG1 #47bis v2.0.0", MCC Support, 3GPP TSG RAN WG1 Meeting #48, R1-071245, Feb. 2007, pp. 1-116.

"Approved Report of 3GPP TSG RAN WG1 #47", MCC Support, 3GPP TSG RAN WG1 Meeting #47bis, R1-070633, Jan. 2007, pp. 1-110.

Daesun Oh, Parhi K.K.: "Area efficient controller design of barrel shifters for reconfigurable LDPC decoders," Circuits and Systems, 2008. ISCAS 2008. IEEE International Symposium on, 20080518, IEEE, Piscataway, NJ, USA, pp. 240-243, ISBN1-4244-1683-3, May 2008.

"Access and Alignment of Data in an Array Processor". Duncan H. Lawrie. IEEETransactions on Computers, vol. C-24, No. 12, Dec. 1975 (pp. 1145-1155).

"Crossbar Switch". Wikipedia.< http://en.wikipedia.org/wiki/Crossbar_switch> [(6 pages) accessed May 19, 2010].

"Omega Network" Wikipedia. http://en.wikipedia.org/wiki/Omega_network [(2pages) accessed May 19, 2010].

Takeshita, O. Y., "On Maximum Contention-Free Interleavers and Permutation Polynomials Over Integer Rings," Mar. 3, 2006, pp. 1249-1253, IEEE Transactions on Information Theory, vol. 52, No. 3.

Benedetto, S. et al., "Design issues on the parallel implementation of versatile, high-speed iterative decoders," Apr. 3-7, 2006, 10 pages, Turbo—Coding—2006, Munich.

Tarable, A. et al., "Mapping Interleaving Laws to Parallel Turbo and LDPC Decoder Architectures," Sep. 2004, pp. 2002-2009, IEEE Transactions on Information Theory, vol. 50, No. 9.

Dawid, H. et al., "Real-Time Algorithms and VLSI Architectures for Soft Output Map Convolutional Decoding", in $6^{th}$ IEEE International Symposium on Personal, Indoor and Mobile Radio Communications, Toronto, Canada, vol. 1, pp. 193-197, Sep. 1995.

Huettinger, S. et al., "Memory Efficient Implementation of the BCJR Algorithm, in Proceedings of the $2^{nd}$ International Symposium on Turbo Codes and Related Topics", Brest, France, Sep. 4-7, 2000, pp. 479-482.

Gnaedig, D. et al., "Les Turbo-Codes à Roulettes", Internet Citation, XP-002387617, (retrieved Jun. 27, 2006).

Tarable, A et al., "Mapping interleaving laws to parallel Turbo decoder architectures", Internet Citation, Jan. 4, 2005, XP-002464595.

When N: "SOC-Network for Interleaving in Wireless Communications", Internet Citation, Jul. 2004, XP-002464593, pp. 1-13.

* cited by examiner

PROVIDE A MEMORY BANK HAVING A PLURALITY OF MEMORIES, A FORWARD UNIT CONFIGURED TO APPLY LOGICAL MEMORY ADDRESSES TO THE MEMORY BANK IN A FORWARD TWOFOLD ACCESS ORDER, A BACKWARD UNIT CONFIGURED TO APPLY LOGICAL MEMORY ADDRESSES TO THE MEMORY BANK IN A BACKWARD TWOFOLD ACCESS ORDER, AND A BUTTERFLY NETWORK DISPOSED BETWEEN THE MEMORY BANK AND THE FORWARD UNIT AND THE BACKWARD UNIT — 50

GENERATE A SET OF CONTROL SIGNALS AND APPLY THE GENERATED SET OF CONTROL SIGNALS TO THE BUTTERFLY NETWORK SO AS TO ACCESS THE MEMORY BANK WITH AN 8-TUPLE PARALLELISM IN A SELECTED ONE OF A LINEAR ORDER AND A QUADRATIC POLYNOMIAL ORDER FOR ANY EIGHT OF THE LOGICAL ADDRESSES WITHOUT MEMORY ACCESS CONFLICT — 52

ADDRESS GENERATION FOR MULTIPLE ACCESS OF MEMORY

TECHNICAL FIELD

The teachings herein relate generally to wireless communication systems, methods, devices/apparatuses, and computer software for same, and exemplary embodiments relate to turbo decoder memory access and an architecture for such a turbo decoder.

BACKGROUND

E-UTRAN is a wireless communication system that is evolved from the universal mobile telecommunications system (UMTS) terrestrial radio access network system. As set forth currently at 3GPP (third generation partnership project) TS 36.212, there are to be 188 different turbo frames for turbo codes. Channel codes are applied at the transmitting device to establish protection of data (user data or control data) against many kind of errors caused by disturbing factors in a wireless air interface channel. Then the coded data has to be decoded at the receiver to recover original data at a receiver. Turbo codes are commonly used for data protection between two or more communication devices like mobile phones, network access nodes (e.g., e-NodeB, NodeB, base station, wireless local area network access point). Such devices use a turbo decoder to decode this coded data.

One element of E-UTRAN (though not limited to only that wireless protocol) is the use of high speed data links (e.g., data transfer speed higher than about 20 Mbps). At such high speed and especially with such a high number of channel codes as noted above for 3GPP TS 36.212, the receiver/turbo decoder needs to process at quite a high rate to decode properly in a real time or near real time manner as the coded data is being received.

Generally there are two simple approaches to such high speed turbo decoding: employ a high clock rate on the ASIC (application specific integrated circuit) that embodies the turbo decoder to keep up with the incoming data rate, or to use parallel processing which allows slower processing on each of the parallel streams without falling behind the incoming data.

A higher ASIC clock rate is limited by higher power consumption, limits to semiconductor technology used to make the ASIC, and a higher end-user price for the device with the high-clock-rate ASIC. Parallel processing enables a faster decoder while avoiding some of those same limitations. Particularly in portable wireless devices (e.g., mobile stations or other portable user equipment UE), power consumption becomes an important design consideration.

Relevant to these teachings are two documents by the same inventor as for the invention detailed herein: U.S. Pat. No. 7,272,771 issued on Sep. 18, 2007 and entitled "NOISE AND QUALITY DETECTOR FOR USE WITH TURBO CODED SIGNALS" (hereinafter, the Noise and Quality Detector reference); and co-pending U.S. patent application Ser. No. 11/810,199 filed on Jun. 4, 2007 and entitled "MULTIPLE ACCESS FOR PARALLEL TURBO DECODER" (hereinafter, the Multiple Access Decoder reference). Each of these documents are incorporated herein by reference in their entirety.

Embodiments of the invention detailed below may simplify some of the operations detailed in those two references noted immediately above, and so can be particularly advantageous for high-speed data links especially where there is a large number of different turbo frames as in 3GPP TS 36.212.

SUMMARY

In accordance with one embodiment of the invention is a method that controls memory accesses during data decoding. In this embodiment there is provided a memory bank having a plurality of memories, a forward unit configured to apply logical memory addresses to the memory bank in a forward twofold access order, a backward unit configured to apply logical memory addresses to the memory bank in a backward twofold access order, and at least a half butterfly network disposed between the memory bank and the forward unit and the backward unit. Further in this embodiment and according to the method is generated a set of control signals which are applied to the at least half butterfly network and the barrel shifters so as to access the memory bank with an n-tuple parallelism in a selected one of a linear order and a quadratic polynomial order for any n-tuple of the logical addresses without memory access conflict, wherein n is a non-zero integer power of two (e.g., n=2, 4, 8, 16, 32, . . . ).

In accordance with another embodiment of the invention is an apparatus that includes a memory bank that has a plurality of memories; a forward unit that is configured to apply logical memory addresses to the memory bank in a forward twofold access order; a backward unit that is configured to apply logical memory addresses to the memory bank in a backward twofold access order; and at least a half butterfly network disposed between the memory bank and the forward unit and the backward unit. This exemplary apparatus further includes a processor that is configured to generate a set of control signals and to apply the generated set of control signals to the at least half butterfly network so as to access the memory bank with an n-tuple parallelism in a selected one of a linear order and a quadratic polynomial order for any n-tuple of the logical addresses without memory access conflict, wherein n is a non-zero integer power of two. Additionally, this exemplary apparatus includes a decoder that is configured to decode received data using values extracted from the memory bank using the n-tuple parallelism.

In accordance with another embodiment of the invention is a program of machine-readable instructions that are embodied on a tangible memory and executable by a digital data processor to perform actions directed toward controlling memory access. According to this exemplary embodiment, the actions include generating a set of control signals and applying the generated set of control signals to at least a half butterfly network that is disposed between a memory bank comprised of a plurality of memories and a bank of logical memory address ports so as to access the memory bank with an n-tuple parallelism in a selected one of a linear order and a quadratic polynomial order for any n-tuple of the logical addresses without memory access conflict. In this embodiment, n is a non-zero integer power of two. The actions further include decoding received data using values extracted from the memory bank using the n-tuple parallelism.

In accordance with another embodiment of the invention is an apparatus that includes storage means having extrinsic storage locations; logical address means for applying logical memory addresses to the memory bank in a forward twofold access order and in a backward twofold access order; switching means disposed between the storage means and the logical address means for selectively coupling individual logical address nodes to individual extrinsic storage locations; computing means for generating a set of control signals and applying the generated set of control signals to the switching means so as to access the storage means with an n-tuple parallelism in a selected one of a linear order and a quadratic polynomial order for any n-tuple of the logical address nodes without conflict among the extrinsic storage locations; and decoding means for decoding data using values extracted from the storage means using the n-tuple parallelism. In this embodiment, n is a non-zero integer power of two. For the case where n is four or eight, the switching means also includes shifting means. In a particular embodiment, the storage means is a memory bank of addressed memory locations; the logical address means is an address generator unit associated with the memory bank; the switching (and shifting) means is an array of transistors or other switches, generically referred to as at least a half butterfly network (with barrel shifters as the shifting means); the computing means is a processor disposed on an application specific integrated circuit; and the decoding means is a turbo decoder.

These and other aspects of the invention are detailed more particularly below.

BRIEF DESCRIPTION OF THE DRAWINGS

The foregoing and other aspects of these teachings are made more evident in the following Detailed Description, when read in conjunction with the attached Drawing Figures.

FIG. 10 is a process flow diagram illustrating elements for accessing a memory according to an exemplary embodiment of the invention.

DETAILED DESCRIPTION

The general methods of the Multiple Access Decoder reference noted above can be applied to turbo codes having quadratic permutation polynomial interleavers for internal interleaving. On the other hand, using special properties of quadratic permutation polynomials one can simplify and optimize parallel processing access schemes. In particular, a routing network between memories and a turbo decoder becomes simple and control bits can be generated on-the-fly. The parallel access schemes described in the exemplary embodiments herein depend on quadratic permutation polynomials.

Embodiments of this invention may be employed in networks that operate, for example, using 3 G, WiMAX, LTE (long term evolution of UTRAN or 3.9 G), HSDPA/HSUPA (high speed downlink/uplink packet access), and other wireless protocols. Embodiments of this invention are not limited to a particular wireless protocol, and may be employed in mobile devices/user equipment and/or network elements such as base stations/Node Bs and the like.

As an initial matter, some of the teachings of the Multiple Access Decoder reference are summarized in order to gain an appreciation of the advantages offered by the teachings newly presented hereinafter. As background to the Multiple Access Decoder reference, certain turbo decoders used for 3 G mobile devices (e.g., cdma2000, WCDMA) use 22 cycles per bit for decoding turbo coded data during ten rounds. Using the multiple access rule of order 2, 4, and 8, the cycle efficiency is about 11, 5.5, and 2.75 cycles per bit at 10 rounds, respectively. The exemplary embodiments of this invention provide an ability to design high speed turbo decoders for use with higher data rates, such as those expected for future communication standards, with reasonably low power consumption. The Multiple Access Decoder reference describes embodiments where the degree of parallel processing is a power of 2: 2, 4, 8, and so on. This results from the underlying approach to the problem taken by the inventor, and the teachings newly presented herein continue with that underlying approach and provide advantages for an eight-fold parallelism.

The Multiple Access Decoder reference details explicit algorithms and methods to construct a function F from an address space for a set of memories such that data can be accessed in parallel in two independent orders without an access conflict. The function F associates each address to one memory. In a case of quadratic permutation polynomials, the function F can be chosen to be independent of quadratic polynomials. Then it follows that the explicit algorithms to construct a function F are redundant for quadratic permutation interleavers. Another consequence is that needed routing networks with quadratic permutation polynomials are simpler than those of the Multiple Access Decoder reference.

Figure 1:
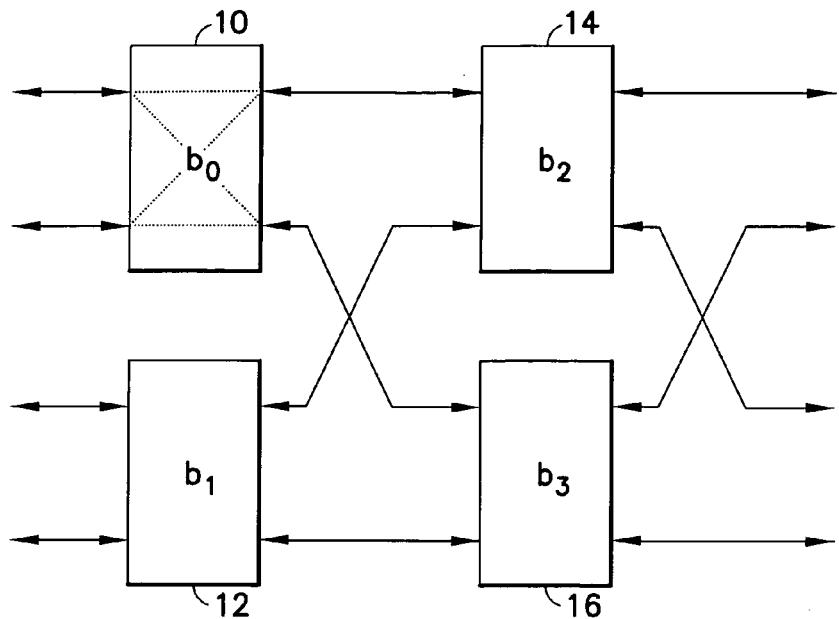
FIG. 1 depicts an exemplary Butterfly network with four buses, and is a reproduction of FIG. 1 of the incorporated Multiple Access Decoder reference.
Figure 2:
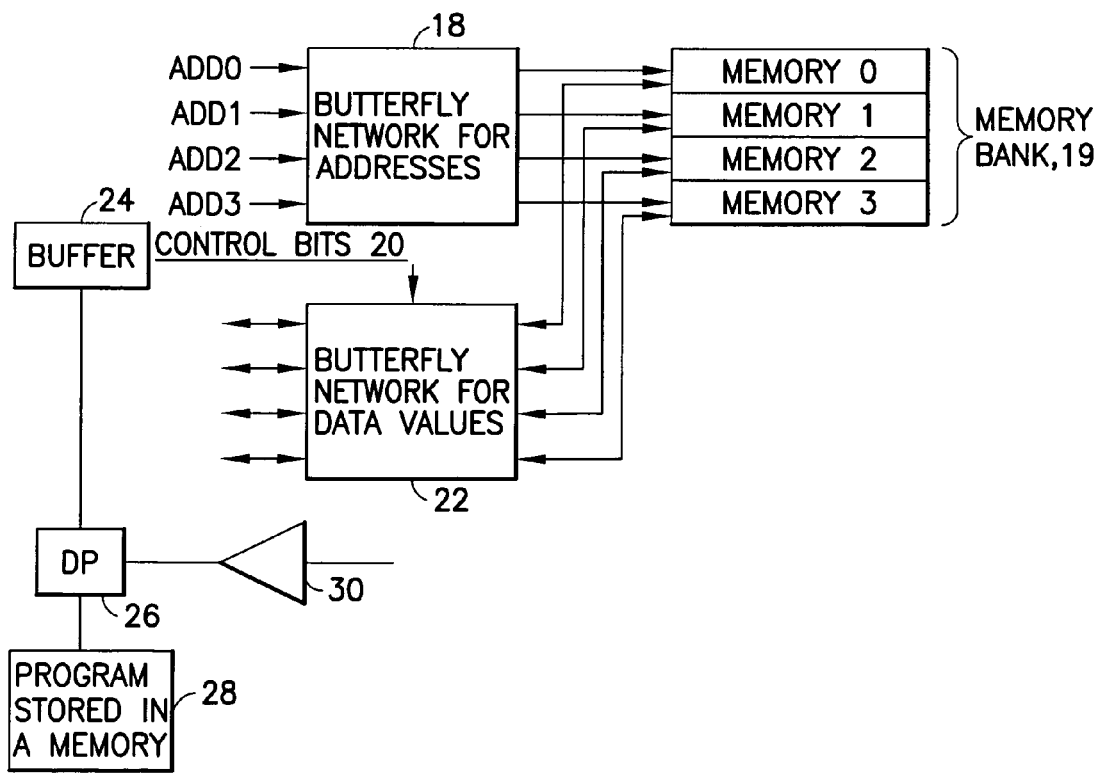
FIG. 2 illustrates a memory bank coupled with the two Butterfly networks to implement parallel processing of degree four, and a data a processor operable for generating a control signal for the Butterfly networks, and is a reproduction of FIG. 2 of the incorporated Multiple Access Decoder reference.

FIGS. 1 and 2 are reproduced from those same figure numbers in the Multiple Access Decoder reference, and show circuitry operable with turbo decoder architecture to implement an embodiment of that reference. While the description below is particular to 4 and 8-tuple parallelism, these teachings may be readily extended to n-tuple parallelism for any integer power of two.

It is well known that a Benes network is able to generate all orders given by a factorial of a number, but its calculation of control bits for that network is a very complex task. At FIGS. 1 and 2 a Butterfly network is applied to parallel turbo decoding as a data router. While a Butterfly network cannot generate as many orders as a Benes network, the number of orders generated is sufficient to establish parallel processing for the orders of turbo decoding that are of interest.

FIG. 1 depicts an exemplary Butterfly network with four buses, and is a reproduction of FIG. 1 of the incorporated Multiple Access Decoder reference. The Butterfly network contains four switches 10, 12, 14 and 16. Each switch is capable of creating a straight connection ($b_0=0$) or a cross connection ($b_0=1$). The control signal of this exemplary Butterfly network is 4-bits: ($b_3$, $b_2$, $b_1$, $b_0$). Data can pass through the Butterfly network from left to right or from right to left.

Referring to FIG. 2, and by example, if the degree of parallel processing is 4 then a first (address) Butterfly network 18 receives as inputs in order to access a bank 19 of four memories (Memory_0, Memory_1, Memory_2, Memory_3): a set of control bits 20 (4 bits, e.g., $b_3$, $b_2$, $b_1$, $b_0$); and four addresses: add0, add1, add2, add3. The four addresses pass through the Butterfly network 18 and are applied to the memory bank 19 connected to output pins of the Butterfly network 18. Four data values are read in parallel from the memory bank 19 (one from each memory Memory_0, Memory_1, Memory_2, Memory_3) and routed to a second (data) Butterfly network 22 in the same manner as the four addresses, but in a reverse direction. The four addresses may be generated either in a linear order or in an interleaved order. The control bits 20 are order and position specific, and are generated in accordance with embodiments of the Multiple Access Decoder reference.

Control bits 20, 4 write addresses, and 4 data values are fed to the address Butterfly network 18 and to the data Butterfly network 22 for a write operation to the same memory bank 19 which uses the same hardware and control lines as the read operation.

The bits of the control signal 20 can be generated in a linear order and an interleaved order according to the Multiple Access Decoder reference. The bits of the control signal 20 may be generated before decoding begins and stored into an auxiliary memory buffer 24. For example, the same butterfly network can be used to store data in the memories and/or retrieve data from the memories in a linear order using one set of control bits, and in an interleaved order using another set of control bits. Both sets of control bits can be the same width for a given degree of parallelism. Control signals for a 2-tuple butterfly network are one bit wide, control signals for a 4-tuple butterfly network are four bits wide, and control signals for an 8-tuple butterfly network are twelve bits wide. In general, a $2^m$-tuple butterfly network requires an $m*2^{m-1}$-bit wide control signal. Note that the parallel processing made possible by the use of the Butterfly networks 18 and 22 is independent of any system interleavers.

Embodiments of the invention may replace the auxiliary memory buffer of control bits 20 by an address generator unit that may provide required time dependent control bits for a routing network. A shared address generator unit can be used for linear order n-tuple access and interleaved order n-tuple access. Such embodiment may simplify a routing network between a turbo decoder and a memory bank of sub memories for extrinsic values. For example, the Multiple Access Decoder reference has a 12-bit wide control signal for an 8-tuple butterfly network whereas in the example embodiment there is only a 4-bit wide time dependent control signal for a routing network smaller than a butterfly network.

The total length of an address space of a memory bank like in FIG. 2 is denoted by N and it is assume that N is a multiple of 8. The length of a component memory of the memory bank is N/n with $n=2^m$ for $m=1, 2, 3$, and so on. An interleaver over the address space $\{0, 1, 2, \ldots, N-1\}$ is denoted by T and its inverse interleaver by $T^{-1}$ (an inverse of an interleaver is called a deinterleaver). A quadratic permutation polynomial interleaver is defined by $T(k)=a*k^2+b*k+c$ (modulo N) for $k=0, 1, 2, \ldots, N-1$. In a paper entitled "Interleavers for Turbo Codes Using Permutation Polynomials Over Integer Rings" by J. Sun and O. Y. Takeshita, IEEE TRANSACTIONS ON INFORMATION THEORY, VOL. 51, NO. 1, January 2005, pages 101–119 (hereinafter, Takeshita), it is shown how to verify whether or not given numbers a, b, c, and N define a quadratic permutation polynomial. In particular, a is even and b is odd always when N is a multiple of 8. The following notations are used below in describing the exemplary embodiments. A multiple access function from the address space $\{0, 1, 2, \ldots, N-1\}$ to the component memory space $\{0, 1, 2, \ldots, n-1\}$ is denoted by $F_n$, and a data value having an address $k=0, 1, 2, \ldots, N-1$, is in a component memory $F_n(k)$ of the memory bank.

The linear order n-tuple data access $P_n$ is defined by $P_n(k)=(a_0(k), a_1(k), a_2(k), a_{n-1}(k))$ for $k=0, 1, 2, \ldots N/n-1$, where the component functions $a_j(k)$ describe which addresses are applied in parallel at a time and N stands for a length of an address space. It is assumed that values of the component functions $a_j$ shall differ from each other, that is, $a_i(r) \neq a_j(k)$ for $i \neq j$ and for all r and k in the index space $\{0, 1, 2, \ldots, N/n-1\}$. The interleaved order n-tuple data access $P^T_n$ take place via the interleaver T: $P^T_n(k)=(T(a_0(k)), T(a_1(k)), T(a_2(k)), \ldots, T(a_{n-1}(k)))$. The linear order means that component functions $a_j(k)$ are used as they are in $P_n(k)$ and the interleaved order means that component functions $a_j(k)$ are used via the interleaver T: $T(a_j(k))$ in $P^T_n(k)$. In practice, when using a linear n-tuple access scheme, an $j^{th}$ data bus uses addresses generated by $a_j(k)$, and when using an interleaved n-tuple access scheme, an $j^{th}$ data bus uses addresses generated by $T(a_j(k))$. For example, in FIG. 7 data buses are numbered from 0 to 7 on the left and so the index j takes values from 0 to 7.

Quadratic permutation polynomial interleavers do not mix addresses belonging in different remainder classes of n; i.e., if $Add_0 \neq Add_1$ modulo n, then $T(Add_0) \neq T(Add_1)$ modulo n. This fact means that instead solving values $F_n(k)$ of a multiple access function $F_n$ by an algorithm values can be set by the simple formula $$F_n(k) = k \text{ modulo } n \text{ for } k=0, 1, 2, \ldots, N-1. \qquad [1]$$

In other words, a data value that has a logical address k is in the sub memory $F_n(k)$ and has a physical address (k div n), where div stands for integer division. If $a_i(k) \neq a_j(k)$ (modulo n) for $i \neq j$, then the kind of $F_n$ meets the following requirements:

$$F_n(a_i(k)) \neq F_n(a_j(k)) \text{ for } i \neq j \text{ and for all } k=0, 1, 2, \ldots, N/n-1 \text{ (linear order)}. \qquad (i)$$

$$F_n(T(a_i(k))) \neq F_n(T(a_j(k))) \text{ for } i \neq j \text{ and for all } k=0, 1, 2 \ldots N/n-1 \text{ (interleaved order)}. \qquad (ii)$$

So the multiple access function $F_n(k)$ generates collision-free access to the memory bank of n-memories for the two n-tuple data access methods $P_n$ and $P^T_n$ simultaneously. Then a natural question arises: what kind of a routing network is needed to route n-tuples of data between a turbo decoder and a memory bank of n-sub memories using two different access methods $P_n$ and $P^T_n$. A second question is how to control the routing network during decoding data. A third question is how to choose component functions $a_j$ to establish n-fold parallel processing for turbo decoders. Next these questions are discussed for n=2, 4, and 8 and answers are provided. For example, where n=16 or other large power of two, a length N of a data frame is assumed to be a multiple of n.

Two addresses Add0 and Add1 within an n-tuple of addresses can be coupled with a common time dependent crossbar switch if Add0=Add1 modulo (n/2) and Add0≠Add1 modulo n. To construct a routing network between a turbo decoder and a memory bank of sub memories for extrinsic values stems from this fact. Besides time dependent crossbar switches, a routing network consists of time independent crossbar switches. It follows from properties of quadratic permutation polynomial interleavers that if Add0=Add1 modulo (n/2) and Add0≠Add1 modulo n, then also T(Add0)=T(Add1) modulo (n/2) and T(Add0)≠T(Add1) modulo n.

Figure 4:
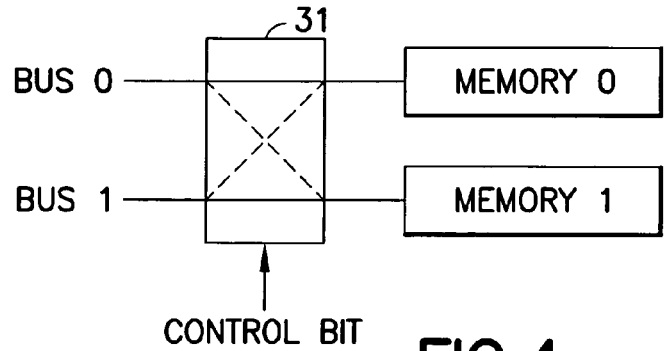
FIG. 4 is a schematic diagram showing two address and memory spaces and a control bit controlling a crossbar switch to route different buses to either of the address and memory spaces for describing the later-detailed embodiments of the invention.

In the Multiple Access Decoder reference, higher degree parallel processing is derived from its lower degree counterpart by dividing each sub address space again into two sets. In connection with quadratic permutation polynomial interleavers a similar approach can be used. Because of the property "if $Add_0 \neq Add_1$ modulo n, then $T(Add_0) \neq T(Add_1)$ modulo n", one can divide addresses in a linear address space and the same division holds for an interleaver address space as well. Hence there is no need to move back and forth between a linear address space and an interleaved address space for solving values of a multiple access function. To illustrate the new approach to address space division, we divide an address space into even and odd addresses: k is replaced by (2p, 2p+1) because either k=2p (even) or k=2p+1 (odd) and p is a positive integer or zero. Data values having even addresses are put into the memory 0 and data values having odd addresses in the memory 1. In both cases a physical address of a data value with a logical address 2p or 2p+1 is p within a sub memory. FIG. 4 illustrates corresponding memory arrangements and a crossbar switch 31 for a routing network. Now it holds that T(2p)≠T(2p+1) modulo 2 whenever T is a quadratic permutation polynomial interleaver.

Next we consider alternative component functions $a_0$ and $a_1$ with practical implementation for twofold 2-tuple parallel access schemes. Once using a turbo decoder that processes two consecutive trellis columns (even and odd) at a time component functions may be $a_0(k)=2k$ and $a_1(k)=2k+1$ for k=0, 1, 2, . . . , N/2−1 for forward processing and for k=N/2−1, N/2−2, . . . , 1, 0 for backward processing. So we can have 2-tuples of addresses for the linear order access scheme $P_2$ and other 2-tuples the quadratic polynomial permutation order access scheme $P^T_2$, such as shown below by [A2a] and [B2a], respectively:

$$P_2(k)=(2k,2k+1); \quad [A2a]$$

$$P^T_2(k)=(T(2k),T(2k+1)); \quad [B2a]$$

where the index k=0, 1, 2, 1 . . . , N/2−1, and N is a length of a turbo interleaver. Another possibility is to process a data frame from both ends simultaneously forward and backward: $a_0(k)=k$ and $a_1(k)=N−k−1$ for k=0, 1, 2, . . . , N−1. Indeed, (k)≠(N−k−1) modulo 2 and it holds that T(k)≠T(N−k−1) modulo 2. Then we have $$P_2(k)=(k,N-k-1); \quad [A2b]$$

$$P^T_2(k)=(T(k),T(N-k-1)) \text{ for } k=0, 1, 2, \ldots, N-1. \quad [B2b]$$

As quadratic polynomials are $2^{nd}$ order polynomials their values can be generated by $2^{nd}$ order differences. Our linear address methods can match with lines in a plane that can be presented also by $2^{nd}$ order differences. This means that we can use $2^{nd}$ order differences to generate physical addresses for a bank of memories by resetting $2^{nd}$ order differences according to applied access scheme: linear order or interleaved order. As a by-product we get control bits for a cross bar network. Second order differences D0, D1 and D2 are calculated from given values $g_k$, $g_{k+1}$, and $g_{k+2}$ as follows:

$$D0=g_k;$$

$$D1=g_{k+1}-g_k \text{ (modulo } N\text{)};$$

$$D2=g_{k+2}-2*g_{k+1}+g_k=g_{k+2}-g_{k+1}-(g_{k+1}-g_k)= (g_{k+2}-g_{k+1})-D1 \text{ (modulo } N\text{)}.$$

We use one triplet $2^{nd}$ order differences per a data bus to generated physical addresses. Because the same polynomial is used for both buses, a third term D2 is equal for the buses and therefore it is called a common term and denoted by $C_T$. Hence two buses share a third term D2. A next value of D0 is calculated by the following recursion:

$$D0=D0+D1 \text{ (modulo } N\text{)};$$

$$D1=D1+C_T \text{ (modulo } N\text{) and } C_T=D2 \text{ stay as a constant.}$$

The linear order 2-tuple data access $P_2$ as in equation [A2a] results in two pairs of $2^{nd}$ order differences: one for 2k and other one for 2k+1. The bus 0 has addresses 0, 2, 4, 6, and so on and the bus 1 uses addresses 1, 3, 5, 7, and so on. Then we have $g_0=0$, $g_1=2$, and $g_2=4$ and so $A0_0=0$, $A1_0=2-0=2$ (modulo N), and a common term $C_T=4-2*2+0=0$ (modulo N). Thus the reset values of the address generator of the bus 0 are $(A0_0, A1_0)=(0, 2)$, and $C_T=0$. The reset values of the address generator of the bus 1 are calculated in the same way and they are $(A0_1, A1_1)=(1, 2)$. Addresses for the bus 0 are equal to $(A0_0/2)$ and control bits of the cross bar switches are equal to ($A0_0$ modulo 2). The two buses use common control bits. In this particular case control bits are constantly 0. Addresses for the bus 1 are $(A0_1/2)$.

The quadratic permutation polynomial interleaved order 2-tuple access $P^T_2$ as in equation [B2a] has two kind of $2^{nd}$ order differences: $A0_0=T(0)$, $A1_0=T(2)-T(0)$ (modulo N) for the bus 0 and $A0_1=T(1)$, $A1_1=T(3)-T(1)$ (modulo N) for the bus 1. A common term $C_T=T(4)-2*T(2)+T(0)$ (modulo N)=8*a (modulo N). Actual numeric values depend on a quadratic permutation polynomial.

When using twofold 2-tuple access rules as in equations [A2b] and [B2b], $2^{nd}$ order differences of the address generator unit can be reset according to a desired access rule: linear or interleaved. The bus 0 has addresses 0, 1, 2, 3, . . . , and T(0), T(1), T(2), . . . , in linear access and in interleaved access, respectively. So the second order differences of the bus 0 can be reset by $(A0_0, A1_0)=(0, 1)$ and by $(A0_0, A1_0)=(T(0), T(1)-T(0))$ (modulo N) in linear access and in interleaved access, respectively. More broadly stated, the second order differences are reset according to either values of component functions for linear order n-tuple access or values of a quadratic polynomial permutation at values of component functions for interleaved order n-tuple access. Where n is a power of two (but not zero). The bus 1 has addresses N−1, N−2, N−3, N4, . . . , and T(N−1), T(N−2), T(N−3), . . . , in linear access and in interleaved access, respectively. The two terms of second order differences of the bus 1 can be reset by $(A0_1, A1_1)=(N-1, -1)$ and by $(A0_1, A1_1)=(T(N-1), T(N-2)-T(N-1))$ (modulo N) in linear access and in interleaved access, respectively. The common term of the address generators of the buses has initial values $C_T=0$ and $C_T=T(2)-2*T(1)+T(0)=2*a$ (modulo N) for linear access and interleaved access, respectively. In the shown exemplary access cases physical addresses for the bus 0 are equal to $(A0_0/2)$ and control bits of the cross bar switches are equal to ($A0_0$ modulo 2). The two buses use common control bits. Addresses for the bus 1 are $(A0_1/2)$.

Reset of address generators for a 2-tuple linear access scheme $P_2(k)=(a_0(k), a_1(k))$ can be done as follows. For j=0 and 1 assign $$A0_j=a_j(0);$$

$$A1_j=a_j(1)-a_j(0) \text{ modulo } N;$$

$$C_T=a_0(2)-2*a_0(0)-a_0(0) \text{ modulo } N.$$

The formula to reset the address generators for a 2-tuple interleaved access scheme $P^T_2(k)=(T(a_0(k)), T(a_1(k)))$ can be with j=0 and 1

$$A0_j=T(a_j(0));$$

$$A1_j=T(a_j(1))-T(a_j(0)) \text{ modulo } N;$$

$$C_T=T(a_0(2))-2*T(a_0(0))-T(a_0(0)) \text{ modulo } N.$$

It can depend on a chosen parallel method whether or not indexing of component function runs also downward starting at N/2−1 and then three values are N/2−1, N/2−2, and N/2−3.

In summary, so far we have seen that second order differences provide a practical method to generate physical addresses for two data buses and (time dependent) control bits for a crossbar switch. Shared address generator units can be used for linear and interleaved access in a unified manner.

To extend 2-tuple parallel access to 4-tuple parallel access we can divide an address space of 2-tuples into an address spaces of 4-tuples by associating addresses with memories 0, 1, 2, and 3 by the formula $$F_4(k)=k \text{ modulo } 4 \text{ for } k=0, 1, 2, \ldots, N-1.$$

Because of the if-property: "if $\text{Add}_0 \neq \text{Add}_1$ modulo 4, then $T(\text{Add}_0) \neq T(\text{Add}_1)$ modulo 4" of quadratic permutation interleavers the above formula leads to contention-free 4-tuple data access both in a linear order and in an interleaved order. Table 1 below illustrates an example how data values can be in the memory bank of four sub memories. Each memory cell in Table 1 holds an address of the memory cell.

TABLE 1

|       | 0 |   |    |    |    |    |     | N/4-1 |
|-------|---|---|----|----|----|----|-----|-------|
| MEM 0 | 0 | 4 | 8  | 12 | 16 | 20 | ... | N-4   |
| MEM 1 | 1 | 5 | 9  | 13 | 17 | 21 | ... | N-3   |
| MEM 2 | 2 | 6 | 10 | 14 | 18 | 22 | ... | N-2   |
| MEM 3 | 3 | 7 | 11 | 15 | 19 | 23 | ... | N-1   |

Figure 5:
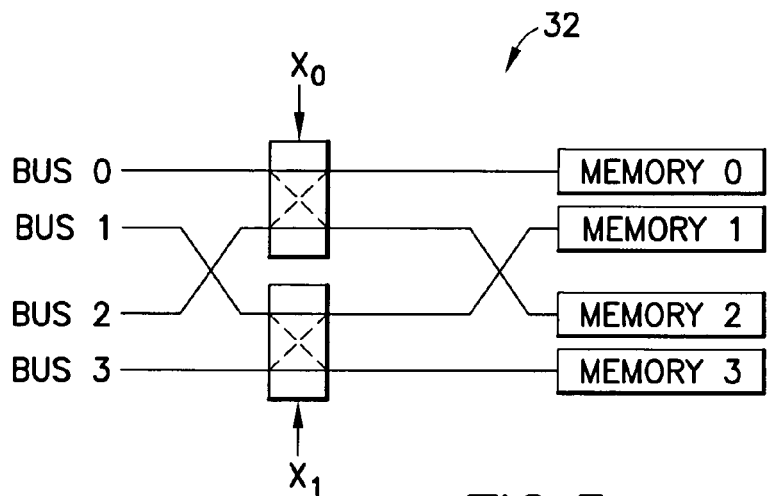
FIG. 5 is a schematic diagram showing four address and memory spaces, a half butterfly network, and two control bits.
Figure 6:
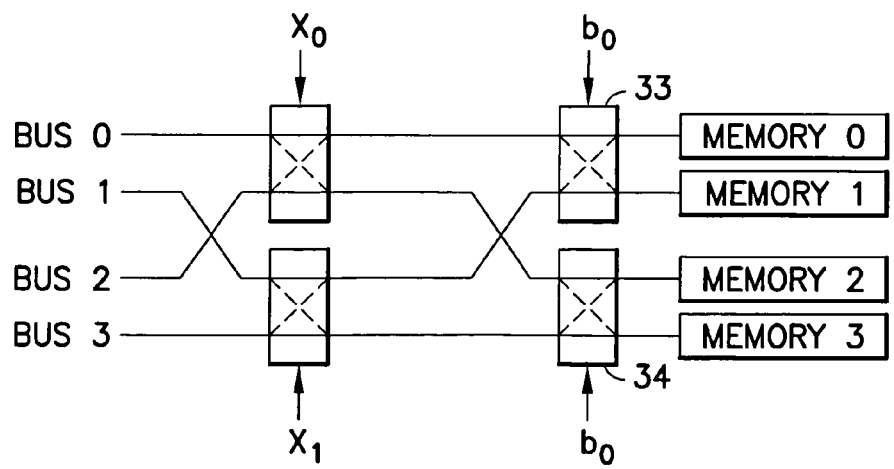
FIG. 6 is similar to FIG. 5 but with two barrel shifters disposed between the memory spaces and the switches according to an exemplary embodiment of the invention.

To construct a routing network, we determine two parallel addresses out of four $(a_0(k), a_1(k), a_2(k), a_3(k))$ to share a crossbar switch (e.g., $X_0$ or $X_1$ in FIGS. 5 and 6) if $a_i(k)=a_j(k)$ modulo 2 for i≠j with i and j in {0, 1, 2, 3}. The crossbar of $X_0$ of buses 0 and 2 in FIGS. 5 and 6 controls two component functions that satisfy $a_i(k)=a_j(k)=0$ modulo 2. Likewise the crossbar of $X_1$ of buses 1 and 3 in FIGS. 5 and 6 controls two component functions that satisfy $a_i(k)=a_j(k)=1$ modulo 2. Two memories with indexes i and j such that i=j modulo 2 constitute a pair. Therefore two memories that match with two addresses sharing a crossbar switch are a pair. Moreover, we denote two component functions connected to the crossbar of $X_0$ of buses 0 and 2 in FIGS. 5 and 6 by $a_0(k)$ and $a_2(k)$, respectively. In the same way, two component functions connected to the crossbar of $X_1$ of buses 1 and 3 in FIGS. 5 and 6 by $a_1(k)$ and $a_3(k)$, respectively. The control bit $b_0$ in FIG. 6 are zero in connection with 4-tuple linear access.

Interleaved 4-tuples $(T(a_0(k)), T(a_1(k)), T(a_2(k)), T(a_3(k)))$ are associated with buses 0, 1, 2, and 3 thru an index j of an interleaved component function $T(a_j(k))$. Once using interleaved 4-tuple access, the control bit $b_0$ in FIG. 6 depend on a quadratic permutation polynomial $T(k)=a*k^2+b*k+c$ (modulo N) for k=0, 1, 2, ..., N−1: the coefficient c impacts to $b_0$. FIG. 5 illustrates special case of FIG. 6 corresponding to quadratic permutation interleavers with c=0. We call a routing network of FIG. 5 a half butterfly network. A routing network in FIG. 6 is a half butterfly network extended by two barrel shifters 33 and 34. The network of FIG. 6 is essentially same as that of FIG. 1.

This brings us to apply an exemplary embodiment of the present invention to 4-tuple parallel memory access. The multiple access function $F_4$ maps a data value having an address (k) to a sub memory (k modulo 4) and within the sub memory the data value sits at (k div 4). We can use any kind of four component functions $a_j(k)$, j=0, 1, 2, 3, as long as they satisfy $$a_j(k)=a_{j+2}(k)=j \text{ modulo 2 for } j=0 \text{ and } 1;$$

$$a_i(k) \neq a_j(k) \text{ modulo 4 for } i \neq j, \text{ for } i \text{ and } j=0, 1, 2, \text{ and } 3.$$

In particular, we have $a_0(k) \neq a_2(k)$ modulo 4 and $a_1(k) \neq a_3(k)$ modulo 4. Then it follows from special properties of quadratic permutation polynomial interleavers that four interleaved component functions $T(a_j(k))$, j=0, 1, 2, 3, satisfy $$T(a_i(k))=T(a_{i+2}(k)) \text{ modulo 2 for } i=0 \text{ and } 1.$$

$$T(a_i(k)) \neq T(a_j(k)) \text{ modulo 4 for } i \neq j, \text{ for } i \text{ and } j=0, 1, 2, \text{ and } 3.$$

For example, useful component functions are defined by $a_j(k)=4k+j$. So the twofold 4-tuple parallel accesses scheme is $$P_4(k)=(4k,4k+1,4k+2,4k+3); \quad [A4a]$$

$$P^T_4(k)=(T(4k),T(4k+1),T(4k+2),T(4k+3)); \quad [B4a]$$

where the index k=0, 1, 2, 1 ..., N/4−1, for linear 4-tuple parallel access, and for interleaved 4-tuple parallel access, respectively. Now it holds that $a_0(k)=a_2(k)=0$ (modulo 2) and that $a_1(k)=a_3(k)=1$ (modulo 2). Therefore the linear order 4-tuple parallel access scheme $P_4$ of [A4a] forms two pairs of memories out of four memories. Because of special features of quadratic permutation polynomials, we also have $T(a_0(k))=T(a_2(k))$ (modulo 2) and $T(a_1(k))=T(a_3(k))$ (modulo 2). So the interleaved order 4-tuple access scheme $P^T_4$ of [B4a] obeys the pairing rule of four memories as well. This kind of twofold 4-tuple parallel access scheme can be used when computing path metrics both backward and forward over four trellis columns within one memory access.

Like in the case n=2, another possibility is to process a data frame from both ends simultaneously forward and backward: $a_0(k)=2k$, $a_1(k)=2k+1$, $a_2(k)=N-2(k+1)$, $a_3(k)=N-2(k+1)+1$, for k=0, 1, 2, ..., N−1. Indeed, $a_j(k)$ modulo 4=j and so it holds that $T(a_j(k)) \neq T(a_i(k))$ modulo 4 for j≠i. Then we have $$P_4(k)=(2k,2k+1,N-2(k+1),N-2(k+1)+1); \quad [A4b]$$

$$P^T_4(k)=(T(2k),T(2k+1),T(N-2(k+1)),T(N-2(k+1)+1)); \quad [B4b]$$

where k=0, 1, 2, ..., N/2−1, for linear 4-tuple parallel access, and for interleaved 4-tuple parallel access, respectively. The mirror twofold 4-tuple access scheme can be useful for a turbo decoder that can connect four buses 0 and 1 to a forward unit and other four buses 2 and 3 to a backward unit; see FIGS. 5 and 6. This kind of turbo decoder is able to decode four trellis columns per data access.

FIG. 5 illustrates memory arrangements and a half butterfly network 32 for a routing network for twofold 4-tuple access when a quadratic permutation polynomial interleaver is given by the formula $T(k)=a*k^2+b*k$ (modulo N), in other words, c=0. The control bits $X_0$ and $X_1$ are time dependent. Values for $X_0$ and $X_1$ are derived from second least significant bits of addresses for buses 0 and 1, respectively.

Once c≠0, two barrel shifters are used to route data between a half butterfly network and four sub memories. In this case barrel shifters are just crossbar switches and this network can be the same as in FIG. 1. FIG. 6 depicts a 4-tuple half butterfly network with two barrel shifters 33, 34. The control bit $b_0$ of two barrel shifters is a least significant bit $c_0$ of the constant c for interleaved order access and zero for linear order access.

Addresses for buses 0, 1, 2, and 3 are generated using second order differences as in the case n=2 but now there are four address generators. A second order term D2 is stored separately as a common term because second order terms of four address generators are equal. For example, when using the parallel access rule of equation [A4a] for data access, the four address units are reset as follows. The address generators of buses 0, 1, 2, 3 have reset values $(A0_0, A1_0)=(0/2, (4-0)/2)=(0,2)$, $(A0_1, A1_1)=(1/2, (5-1)/2)=(0,2)$, $(A0_2, A1_2)=(2/2, (6-2)/2)=(1,2)$, and $(A0_3, A1_3)=(3, (7-3)/2)=(1,2)$ with the common term $C_T=0$, respectively. In other words, reset values are obtained by dividing corresponding logical addresses by 2. A physical address of each bus j is $A0_j/2$ and the control bit $X_0$ is $A0_0$ modulo 2 and the control bit $X_1$ is $A0_1$ modulo 2. The control bit $b_0=0$ for linear order access. A next value of $A0_j$ is calculated by the following recursion:

$$A0_j = A0_j + A1_j \text{ (modulo } N);$$

$$A1_j = A1_j + C_T \text{ (modulo } N) \text{ and } C_T \text{ stays as a constant.}$$

In the case of the parallel access rule of equation [B4a], reset values of four address generators are set by $(A0_0, A1_0)=(T(\mathbf{0})/2, (T(\mathbf{4})-T(\mathbf{0}))/2)$, $(A0_1, A1_1)=(T(\mathbf{1})/2, (T(\mathbf{5})-T(\mathbf{1}))/2)$, $(A0_2, A1_2)=(T(\mathbf{2})/2, (T(\mathbf{6})-T(\mathbf{2}))/2)$, and $(A0_3, A1_3)=(T(\mathbf{3})/2, (T(\mathbf{7})-T(\mathbf{3}))/2)$ with the common term $C_T=(T(\mathbf{8})-2*T(\mathbf{4})+T(\mathbf{0}))/2$. That is, $C_T=32*a/2=16*a$ modulo N. The control bit $b_0=c_0$, a least significant bit of a lower order term of a quadratic permutation polynomial for interleaved order access. In both cases the four address generators are applied in the same way to accessing a memory bank of four sub memories.

The twofold parallel access scheme given by [A4b] and [B4b] can be treated as similar to equations [A4a] and [B4a]. Four address generators for the 4-tuple parallel access rule of equation [A4b] can be reset as follows: $(A0_0, A1_0)=(0/2, (2-0)/2)=(0,1)$, $(A0_1, A1_1)=(1/2, (3-1)/2)=(0,1)$, $(A0_2, A1_2)=((N-2)/2, (N-4-N+2)/2)=(N/2-1, -1)$, and $(A0_3, A1_3)=((N-1)/2, (N-3-N-1)/2)=(N/2-1, -1)$ with the common term $C_T=0$. The control bit $b_0=0$ is generated for equation [A4b]. In an exemplary case of the 4-tuple parallel access rule of equation [B4b], the reset values for the four address generators are set by formula $(A0_0, A1_0)=(T(\mathbf{0})/2, (T(\mathbf{2})-T(\mathbf{0}))/2)$, $(A0_1, A1_1)=(T(\mathbf{1})/2, (T(\mathbf{3})-T(\mathbf{1}))/2)$, $(A0_2, A1_2)=(T(N-2)/2, (T(N-4)-T(N-2))/2)$, and $(A0_3, A1_3)=(T(N-1)/2, (T(N-3)-T(N-1))/2)$ with the common term $C_T=(T(\mathbf{4})-2*T(\mathbf{2})+T(\mathbf{0}))/2=16*a/2=8*a$ modulo N. Four address generators are used to generate physical addresses and the control bits of a 4-tuple routing network as in the cases of equations [A4a] and [B4a]. The control bit $b_0=c_0$, a least significant bit of a lower order term of a quadratic permutation polynomial.

If a quadratic permutation polynomial has c=0, one can use at least a half butterfly network 32 of FIG. 5. If c≠0, one applies at least a half butterfly network with two barrel shifters 33, 34 as in FIG. 6 for routing data between a turbo decoder and a memory bank of four sub memories. In the case of n=4, at least a half butterfly network with two barrel shifters can be same as a butterfly network in FIG. 1. The control bit $b_0$ of the two barrel shifters is zero for the linear order access and its value for interleaved access order is a least significant bit of a lower order term of a quadratic permutation polynomial.

An example to reset address generators for a 4-tuple linear access scheme $P_4(k)=(a_0(k), a_1(k), a_2(k), a_3(k))$ is as follows. For j=0, 1, 2, and 3 assign $$A0_j = a_j(0) \text{ div } 2;$$

$$A1_j = (a_j(1) - a_j(0)) \text{ div } 2 \text{ modulo } N;$$

$$C_T = (a_0(2) - 2*a_0(0) - a_0(0)) \text{ div } 2 \text{ modulo } N.$$

The control bit $b_0$ is set zero if present. The same formulae for a 4-tuple interleaved access scheme $P^T_4(k)=(T(a_0(k)), T(a_1(k)), T(a_2(k)), T(a_3(k)))$ are with j=0, 1, 2, and 3

$$A0_j = T(a_j(0)) \text{ div } 2;$$

$$A1_j = (T(a_j(1)) - T(a_j(0))) \text{ div } 2 \text{ modulo } N;$$

$$C_T = (T(a_0(2)) - 2*T(a_0(0)) - T(a_0(0))) \text{ div } 2 \text{ modulo } N.$$

The control bit $b_0$ is set to (c modulo 2). It depends on a chosen parallel method whether or not indexing of component function runs also downward starting at N/4−1 and then three values are N/4−1, N/4−2, and N/4−3. The reset values of four address generators are divided by 2 to reserve one bit to control crossbar switches of $X_0$ and $X_1$ in FIGS. 4, 5, and 6.

In a nutshell, second order differences provide a practical method to generate physical addresses for four data buses and time dependent control bits for crossbar switches 31, 33, 34 of a routing network. The same four address generator units can be used for linear and interleaved access in a unified manner. Initial values of the four address generator units depend on a 4-tuple parallel access rule (linear or interleaved), a frame length (FIG. 3), and a quadratic permutation polynomial. Second order terms of address units are equal and there is one common term that is used as a second order term for calculating next physical addresses of four buses.

Which brings us to the description of certain exemplary embodiment of the present invention, embodiments of which are also concerned with 8-tuple memory access. But whereas the Multiple Access Decoder reference accesses without memory access conflict according to a rule in a linear order and an interleaved order, embodiments of this invention access without memory access conflict according to a rule in a linear order (specifically, an ascending order) and in a quadratic polynomial order (specifically, in a quadratic polynomial permutation order).

Twofold 8-tuple parallel access schemes using quadratic permutation polynomials stem also from the fact that if $a_j(k) \neq a_i(k)$ modulo 8, j≠i, then also $T(a_j(k)) \neq T(a_i(k))$ modulo 8. There is no need for solving a multiple access function, it may follow from the formula [1] with n=8 that a data value having address k is in a sub memory (k modulo 8) at a sub memory address (k div 8). The memories (mem0, mem1, mem2, etc.) may form pairs of memory spaces such that two memory spaces are a pair if the indexes i and j of the two memories satisfies i=j modulo 4. Two logical addresses $a_p(k)$ and $a_q(k)$ out of eight on eight buses (at the left side of FIGS. 7, 8, and 9) may use a common crossbar $X_j$ (e.g., $X_0$, $X_1$, $X_2$, or $X_3$) if $a_p(k)=a_q(k)=j$ modulo 4. We denote two addresses $a_p(k)$ and $a_q(k)$ that the crossbar $X_p$ controls by $a_p(k)$ and $a_{p+4}(k)$. So addresses that the crossbar $X_p$ controls satisfy $a_p(k)=a_{p+4}(k)=p$ modulo 4 for p=0, 1, 2, and 3. In other words, eight component functions $a_j(k)$, j=0, 1, 2, . . . , 7, satisfy $$a_j(k) = a_{j+4}(k) = j \text{ modulo } 4 \text{ for } j=0, 1, 2, \text{ and } 3;$$

$$a_i(k) \neq a_j(k) \text{ modulo } 8 \text{ for } i \neq j, \text{ for } i \text{ and } j=0, 1, 2, \ldots, 7.$$

Therefore two memories that match with two addresses sharing a crossbar switch are a pair. The control bit $X_4$ in FIGS. 7, 8 and 9 equals to zero for 8-tuple linear access. Also two control bits $b_1 b_0$ in FIG. 8 are zero in connection with 8-tuple linear access.

Interleaved 8-tuples $(T(a_0(k)), T(a_1(k)), T(a_2(k)), T(a_3(k)), T(a_4(k)), T(a_5(k)), T(a_6(k)), T(a_7(k)))$ are associated with buses 0, 1, 2, 3, 4, 6, and 7 thru an index j of an interleaved component function $T(a_j(k))$. Because of special properties of quadratic permutation polynomial interleavers eight interleaved component functions $T(a_j(k))$, j=0, 1, 2, ..., 7, satisfy $$T(a_i(k)) = T(a_{i+4}(k)) \text{ modulo } 4 \text{ for } i=0, 1, 2, \text{ and } 3;$$

$$T(a_i(k)) \neq T(a_j(k)) \text{ modulo } 8 \text{ for } i \neq j, \text{ for } i \text{ and } j=0, 1, 2, \ldots, 7.$$

Figure 7:
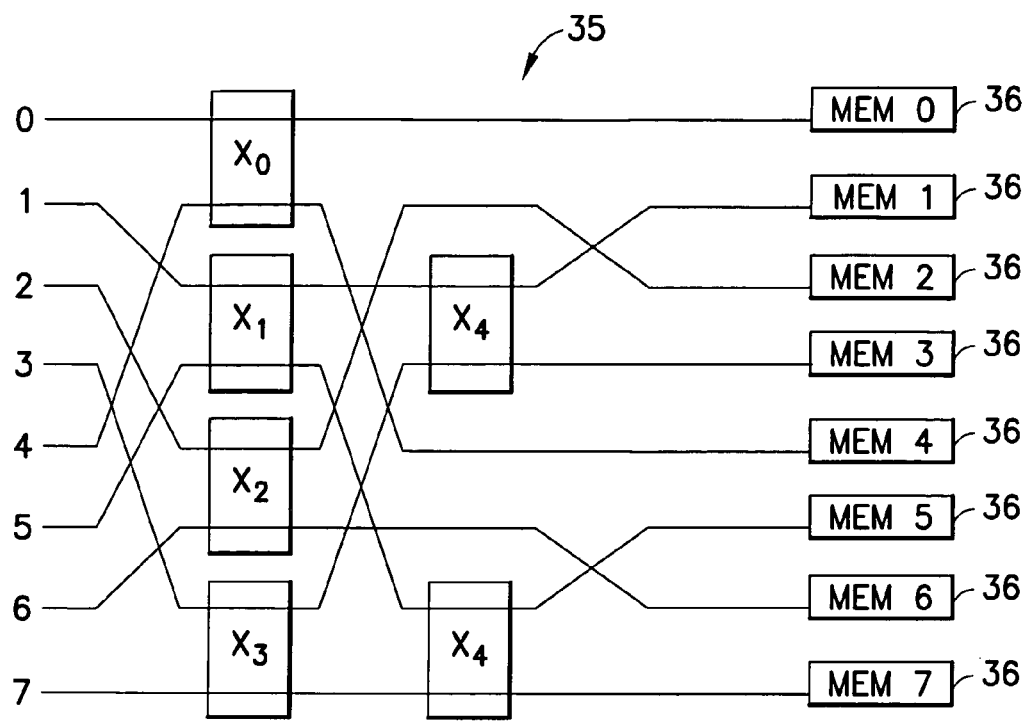
FIG. 7 is a schematic diagram of an eight-tuple half butterfly network and eight memory spaces (or sub-memories).
Figure 8:
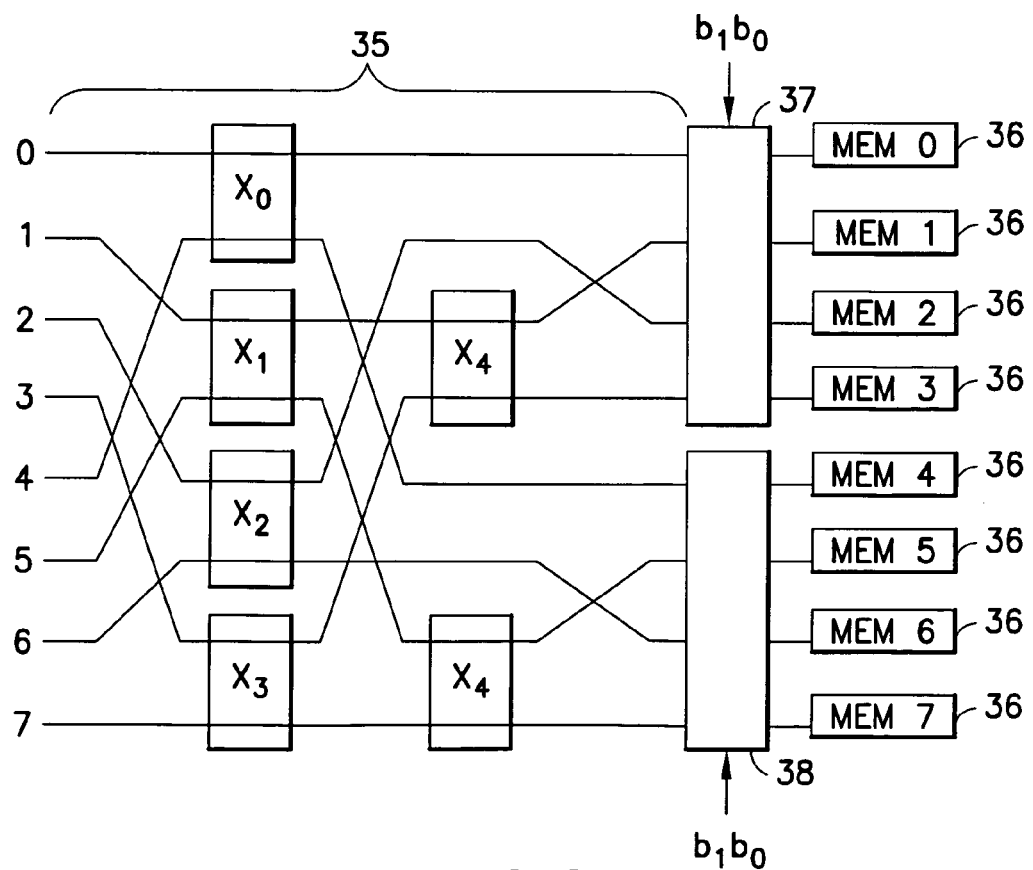
FIG. 8 is similar to FIG. 7 but further with two barrel shifters according to an exemplary embodiment of the invention.
Figure 9:
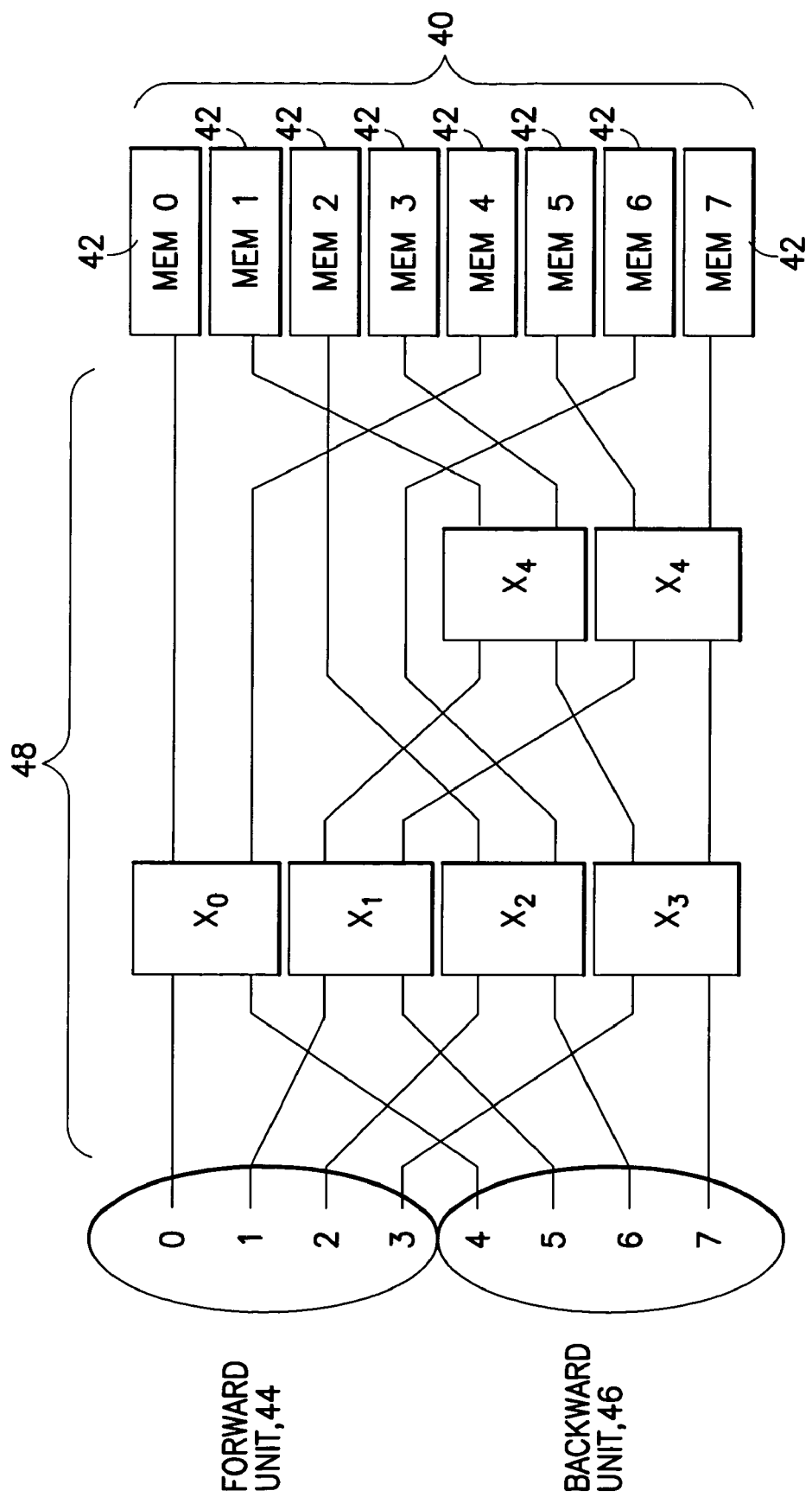
FIG. 9 is a schematic diagram similar to FIG. 7 with a different switching arrangement and also with forward and backward units for accessing eight memories in parallel using two different access orders according to an exemplary embodiment of the invention.

Once using interleaved 8-tuple access, the control bits $X_4$ in FIGS. 7, 8, and 0 and $b_1 b_0$ in FIG. 9 depend on a quadratic permutation polynomial $T(k) = a*k^2 + b*k + c$ (modulo N) for k=0, 1, 2, ..., N−1: the coefficients a and b impact to $X_4$ and the coefficient c to $b_1 b_0$. The control bit $X_4$ is not time dependent but its value is equal to a second least significant bit of the sum (a+b) modulo N for interleaved order access. FIG. 7 illustrates special case of FIG. 8 corresponding to quadratic permutation interleavers with c=0. We call a routing network of FIG. 7 a half butterfly network for 8-tuples. A routing network in FIG. 8 is a half butterfly network extended by two barrel shifters 37 and 38.

The mirror twofold 8-tuple parallel access scheme having linear 8-tuple access $P_8$ and interleaved 8-tuple access $P^T_8$ is defined by:

$$P_8(k) = (4k, 4k+1, 4k+2, 4k+3, N-4(k+1), N-4(k+1)+1, N-4(k+1)+2, N-4(k+1)+3); \quad [A8]$$

$$P^T_8(k) = (T(4k), T(4k+1), T(4k+2), T(4k+3), T(N-4(k+1)), T(N-4(k+1)+1), T(N-4(k+1)+2), T(N-4(k+1)+3)); \quad [A8]$$

where the index k=0, 1, 2, 1 ..., N/4−1, and N is a length of a turbo interleaver being a multiple of 8. Indeed, now $a_j(k) = j$ modulo 8 for j=0, 1, 2, 3, 4, 5, 6, and 7. Hence the mirror twofold 8-tuple parallel access scheme is contention-free for both linear and interleaved access. The mirror twofold 8-tuple access scheme is useful for a turbo decoder that connects four buses from 0 thru 3 to a forward unit and other four buses from 4 thru 7 to a backward unit as shown in FIG. 9. This kind of turbo decoder is able to decode eight trellis columns per data access: four forward and eight backward as in FIG. 3.

Once a lower order term of a quadratic permutation polynomial is zero, c=0, it is possible to use a half butterfly network for routing data between a turbo decoder and a memory bank of eight sub memories. FIG. 7 illustrates an 8-tuple half butterfly network 35 and eight sub memories 36.

Whereas a lower order term a quadratic permutation polynomial is not zero, c≠0, then two barrel shifters 37, 38 of four buses are between a half butterfly network 35 and eight sub memories 36 to take care of finalizing a routing network. FIG. 8 shows a routing network consisting of an 8-tuple half butterfly network 35 and two barrel shifters 37, 38. The two barrel shifters are controlled by a shared signal that is two least significant bits of a lower order term of a quadratic permutation polynomial for interleaved order access. A barrel shifter of 4-data buses is able to do four cyclic shifts for data buses: (A, B, C, D), (D, A, B, C), (C, D, A, B), and (B, C, D, A) that match control bits (00), (01), (10), and (11), respectively.

Data access by 8-tuples requires eight address generator units, one for each data bus. Second order differences provide a good practical method to implement address generator units. Second order differences of an address generator unit is reset according to an applied parallel access rule: either a linear 8-tuple access rule $P_8$ or an interleaved 8-tuple access rule $P^T_8$. The eight address generator units are reset for the linear access rule defined in equation [A8] as follows.

$$(A0j, A1j) = (j/4, (4+j-j)/4) = (0,1) \text{ for } j=0, 1, 2, \text{ and } 3.$$

Others are:

$$(A0_4, A1_4) = ((N-4)/4, (N-8-(N-4))/4) = (N/4-1, -1);$$

$$(A0_5, A1_5) = ((N-3)/4, (N-7-(N-3))/4) = (N/4-1, -1);$$

$$(A0_6, A1_6) = ((N-2)/4, (N-6-(N-2))/4) = (N/4-1, -1), \text{ and}$$

$$(A0_7, A1_7) = ((N-1)/4, (N-5-(N-1))/4) = (N/4-1, -1).$$

The eight address generator units have a common value for a $2^{nd}$ order term: $C_T = 8 - 2*4 + 0 = 0$.

The interleaved access rule $P^T_8$ in equation [B8] have another kind of resetting of the eight address generator units:

$$(A0_0, A1_0) = (T(0)/4, (T(4) - T(0))/4);$$

$$(A0_1, A1_1) = (T(1)/4, (T(5) - T(1))/4);$$

$$(A0_2, A1_2) = (T(2)/4, (T(6) - T(2))/4);$$

$$(A0_3, A1_3) = (T(3)/4, (T(7) - T(3))/4);$$

$$(A0_4, A1_4) = (T(N-4)/4, (T(N-8) - T(N-4))/4);$$

$$(A0_5, A1_5) = (T(N-3)/4, (T(N-7) - T(N-3)))/4);$$

$$(A0_6, A1_6) = (T(N-2)/4, (T(N-6) - T(N-2))/4);$$

$$(A0_7, A1_7) = (T(N-1)/4, (T(N-5) - T(N-1))/4);$$

The common term has a reset value $C_T = (T(8) - 2*T(4) + T(0))/4 = 32*a/4 = 8*a$ (modulo N). Because a communication system in practice has a finite number of different quadratic permutation polynomials to support, it is possible to pre-calculate needed reset values which are stored as an array in a local memory. Then the resetting step becomes very fast and easy.

Use of eight address generator units is independent of resetting: a physical address of each data bus is $(A0_j/2)$ for j=0, 1, 2, 3, 4, 5, 6, and 7. The four control bits $X_0, X_1, X_2$, and $X_3$ of an 8-tuple half butterfly network are derived from four address units $A0_0, A0_1, A0_2$, and $A0_3$ by taking a least significant bit from each: $X_j = A0_j$ modulo 2 for j=0, 1, 2, and 3. A next value of $A0_j$ is calculated by the following recursion:

$$A0_j = A0_j + A1_j \text{ (modulo } N);$$

$$A1_j = A1_j + C_T \text{ (modulo } N) \text{ and } C_T \text{ stays as a constant.}$$

Once using linear order access, the control bit $X_4 = 0$ and two control bits of two barrel shifters are zero: $b_0 b_1 = 00$. In interleaved order access $X_4$ is a second least significant bit of a sum (a+b) modulo N and two control bits of two barrel shifters are equal to two least significant bits of a lower order term of a quadratic permutation polynomial: $b_0 b_1 = c_0 c_1$.

In a case of 8-tuple memory access data values are in sub memories 36 such that a data value having a logical address k is in a sub memory (k modulo 8) at address (k div 8). Table 2 below illustrates how data values are in the memory bank of eight sub memories. Each memory cell in Table 1 holds a logical address of the memory cell 36. For example, the number 23 in the sub memory 7 depicts that a data value having a logical address 23 is in the sub memory 7 at address 2.

TABLE 2

| | 0 | | | | | | | N/8-1 |
|---|---|---|---|---|---|---|---|---|
| MEM 0 | 0 | 8 | 16 | 24 | 32 | 48 | ... | N-8 |
| MEM 1 | 1 | 9 | 17 | 25 | 33 | 49 | ... | N-7 |
| MEM 2 | 2 | 10 | 18 | 26 | 34 | 50 | ... | N-6 |

TABLE 2-continued

|       | 0 |    |    |    |    |    |     | N/8-1 |
|-------|---|----|----|----|----|----|-----|-------|
| MEM 3 | 3 | 11 | 19 | 27 | 35 | 51 | ... | N-5   |
| MEM 4 | 4 | 12 | 20 | 28 | 36 | 52 | ... | N-4   |
| MEM 5 | 5 | 13 | 21 | 29 | 37 | 53 | ... | N-3   |
| MEM 6 | 6 | 14 | 22 | 30 | 38 | 54 | ... | N-2   |
| MEM 7 | 7 | 15 | 23 | 31 | 39 | 55 | ... | N-1   |

Figure 3:
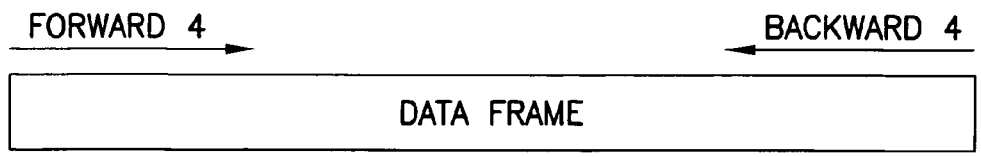
FIG. 3 illustrates accessing data frame symmetrically with respect to a mid point of the data frame according to an exemplary embodiment of the invention.

FIG. 3 illustrates the access method. In the linear order shown there the access is toward the mid-point of the data frame in both a forward direction which is represented as the first four entries of the order equation [A8] above, and also in a backward direction which is represented as the last four entries of the order of equation [A8] above for N being a multiple of eight.

After all, the general principle to reset address generators for a 8-tuple linear access scheme $P_8(k)=(a_0(k), a_1(k), a_2(k), a_3(k), a_4(k), a_5(k), a_6(k), a_7(k))$ is as follows. For $j=0, 1, 2, 3, 4, 5, 6,$ and 7 assign $$A0_j = a_j(0) \text{ div } 4;$$

$$A1_j = (a_j(1) - a_j(0)) \text{ div } 4 \text{ modulo } N;$$

$$C_T = (a_0(2) - 2*a_0(0) - a_0(0)) \text{ div } 4 \text{ modulo } N.$$

The control bits $X_4$ and $b_1 b_0$ are set zero. The same formulae for a 8-tuple interleaved access scheme $P^T_8(k)=(T(a_0(k)), T(a_1(k)), T(a_2(k)), T(a_3(k)), T(a_4(k)), T(a_5(k)), T(a_6(k)), T(a_7(k)))$ are with $j=0, 1, 2, 3, 4, 5, 6,$ and 7:

$$A0_j = T(a_j(0)) \text{ div } 4;$$

$$A1_j = (T(a_j(1)) - T(a_j(0))) \text{ div } 4 \text{ modulo } N;$$

$$C_T = (T(a_0(2)) - 2*T(a_0(0)) - T(a_0(0))) \text{ div } 4 \text{ modulo } N.$$

The control bit $X_4$ is equal to the one bit obtained from (T(1) modulo 4) div 2. The control bit $b_1 b_0$ is set to (c modulo 4). It depends on a chosen parallel method whether or not indexing of component function runs also downward starting at N/8−1 and then three values are N/8−1, N/8−2, and N/8−3. The reset values of eight address generators are divided by 4 to reserve one bit to control crossbar switches of $X_0$, $X_1$, $X_2$, and $X_3$ in FIGS. 7, 8, and 9.

One reason by which the quadratic order is simplified over interleaved order of the Multiple Access Decoder reference stems from special properties of quadratic polynomial permutations. So embodiments of this invention are useful for turbo codes that apply quadratic polynomial permutations to turbo interleaving, and 3GPP TS 36.212 (noted above in background) describe such turbo frames.

Embodiments of this invention provide means for utilization of more internal parallel processing for a turbo decoder.

According to a first embodiment of this invention is a method to generate an 8-tuple of parallel addresses to access eight extrinsic memories in a linear order and in a quadratic polynomial permutation order, all without any access conflict in the memory spaces being accessed. Consider there are eight parallel addresses as above for a turbo frame. This embodiment applies second order differences that are reset according to values of a quadratic polynomial permutation in order to get the addresses for those accesses, which the inventor has found results in a simple recursion to generate addresses.

The second order differences can be updated according to the following procedure (in software programming language) for D0, D1, and D2=some common term:

```
BEGIN
   TEMP0 = D0 + D1; ** UPDATE D0
   IF (TEMP0<LENGTH) THEN
      D0 = TEMP0;
   ELSE
      D0 = TEMP0 − LENGTH;
   ENDIF
   TEMP1 = D1 + COMMONTERM;** UPDATE D1
   IF (TEMP1<LENGTH) THEN
      D1 = TEMP1;
   ELSE
      D1 = TEMP1 − LENGTH;
   ENDIF
END
```

According to another aspect of the invention is a method to route data from and/or to eight parallel extrinsic memories (memory spaces, each memory space having a unique address) thru a half butterfly network and optional two barrel shifters. Control four bits of the half butterfly networks are equal to the least significant bits of the generated addresses. Remaining control bits depends on applied parallel access rule (linear or interleaved) and a used quadratic permutation polynomial.

The pairing of addresses and memories leads to a contention-free access if
   (Add0 mod 4)=(Add1 mod 4) and
   Add0≠Add1 modulo 8.

The ascending order access meets this requirement because Add0=4k+j and Add1=N−4(k+1)+j, where N is a multiple of 8. The same holds also for quadratic polynomials $T(x)=a*x^2+b*x+c$ because the coefficient b is odd. Then Add0=T(4k+j) and Add1=T(N−4(k+1)+j)) form a pair of memory addresses that can be accessed without contention whether accessed by the linear order or accessed by the quadratic polynomial order.

Exemplary embodiments of the invention may be implemented in an application specific integrated circuit ASIC, and is seen to be especially useful when implemented in a modem (modulator/demodulator) particularly in the E-UTRAN system due to the high data rates expected there as noted above. The initialization of differences of address generators can be implemented in software. The four control bits of a half butterfly network as seen at FIGS. 7-9 are generated on-the-fly with addresses. A fifth control bit is a constant for a given quadratic polynomial.

FIG. 9 illustrates another arrangement of the crossbars in the half-butterfly network and no barrel shifters. The device of FIG. 9 includes a memory bank 40 having a plurality of memories 42. A forward unit 44 is an arrangement of nodes to which the logical memory addresses are applied to access the memory bank 40 tuple by tuple either in a forward linear order (e.g., assume no switching but horizontal lines through the two switches of $X_4$) or in a forward interleaved order. The backward unit 46 applies logical memory addresses at its nodes to the memory bank 40 tuple by tuple either in a backward linear order or a backward interleaved order. As can be seen at FIG. 9, the half butterfly network 48 is a switching array that is disposed between the memory bank 40 and the forward unit 44 and the backward unit 46 to effect switching data values for linear order accesses and quadratic polynomial accesses.

There is a processor (e.g., the digital processor 26 of FIG. 2) that generates a set of control signals and applies the generated set of control signals to the butterfly network 48 so as to access the memory bank with an 8-tuple parallelism in either the linear order or the quadratic polynomial order for any eight of the logical addresses at the forward unit 44 and backward unit 46, without memory access conflict. These control signals are applied to the switches $X_0$, $X_1$, $X_2$, and $X_4$, which can be simple transistors in an ASIC embodiment. And also there is a decoder that is configured to decode received data using values extracted from the memory bank 40 using the 8-tuple parallelism.

FIG. 10 shows process steps for implementing an aspect of the invention. At block 50 there is provided a memory bank having a plurality of memories, a forward unit configured to apply logical memory addresses to the memory bank in a forward twofold access order, a backward unit configured to apply logical memory addresses to the memory bank in a backward twofold access order, and a butterfly network and barrel shifters disposed between the memory bank and the forward unit and the backward unit. At block 52a set of control signals is generated and applied to the half butterfly network so as to access the memory bank with an 8-tuple parallelism in a selected one of a linear order and a quadratic polynomial order for any eight of the logical addresses without memory access conflict.

It is possible to increase a degree of internal parallel processing of a turbo decoder from eight to sixteen if a frame length is a multiple of 16. The E-UTRAN document 36.212 determines 188 different lengths for turbo frames. All 188 turbo frame lengths are multiples of 8 and quadratic permutation polynomial interleavers are defined by $T(k)=a*k^2+b*k$ (modulo N) for $k=0, 1, 2, \ldots, N-1$, with the constant term being zero. However, 129 of them are also multiples of 16. Then it is good to apply general methods explained in the Multiple Access Decoder reference with multiple access functions of this invention.

Figure 11:
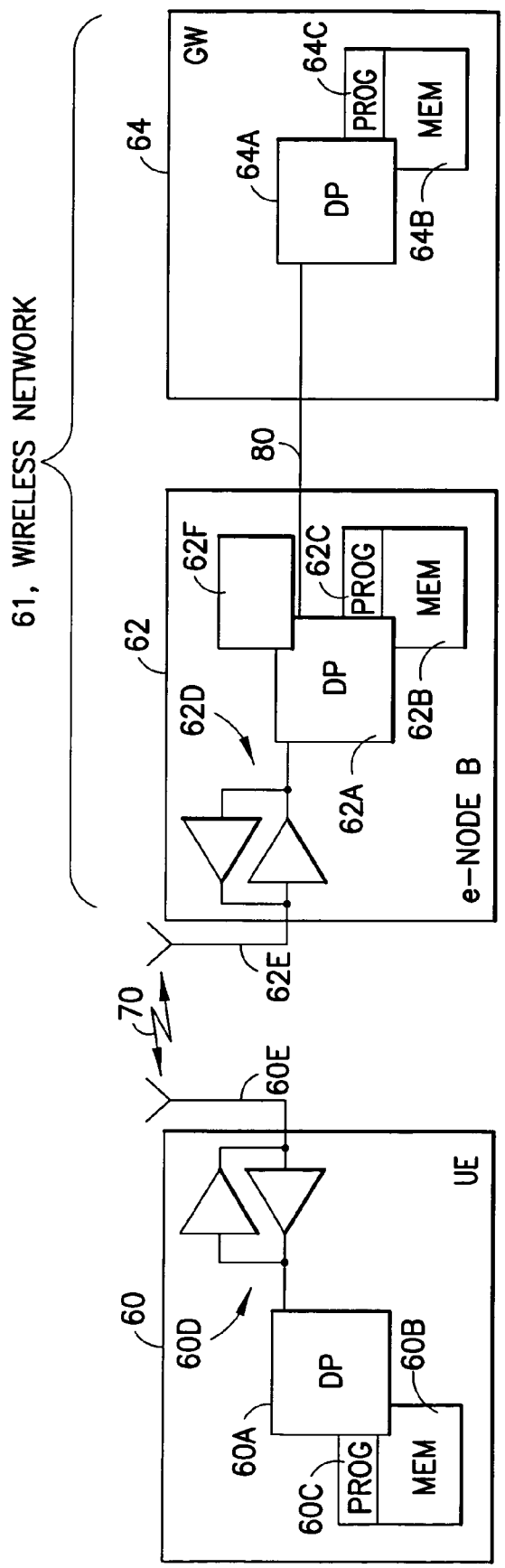
FIG. 11 shows a simplified block diagram of various electronic devices that are suitable for use in practicing the exemplary embodiments of this invention.

Reference is now made to FIG. 11 for illustrating a simplified block diagram of various electronic devices that are suitable for use in practicing the exemplary embodiments of this invention. In FIG. 11 a wireless network 61 is adapted for communication between a UE 60 and a Node B 62 (e-Node B). The network 61 may include a gateway GW/serving mobility entity MME/radio network controller RNC 64 or other radio controller function known by various terms in different wireless communication systems. The UE 60 includes a data processor (DP) 60A, a memory (MEM) 60B that stores a program (PROG) 60C, and a suitable radio frequency (RF) transceiver 60D coupled to one or more antennas 60E (one shown) for bidirectional wireless communications over one or more wireless links 70 with the Node B 62.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and printed electrical connections, as well as by the use of electromagnetic energy, such as electromagnetic energy having wavelengths in the radio frequency region, the microwave region and the optical (both visible and invisible) region, as non-limiting examples.

The Node B 62 also includes a DP 62A, a MEM 62B, that stores a PROG 62C, and a suitable RF transceiver 62D coupled to one or more antennas 62E. The Node B 62 may be coupled via a data path 80 (e.g., Iub or S1 interface) to the serving or other GW/MME/RNC 64. The GW/MME/RNC 64 includes a DP 64A, a MEM 64B that stores a PROG 64C, and a suitable modem and/or transceiver (not shown) for communication with the Node B 62 over the Iub link 80.

Shown separately within the node B 62 (though it may be present equally in the UE 60 and/or the GW 64) is an ASIC 12F that has the butterfly network, forward and reverse units, and the memory spaces detailed above. Within the ASIC 12F is a microprocessor to control functions on the processor, and also a memory on which is stored software to implement aspects of this invention. While shown separately for clarity of illustration, the ASIC can further embody a modem (which is a part of the transceivers 60D, 62D and also present in the GW 64) such that the turbo decoder within the modem decodes according to these teachings in a full function integrated circuit chip.

At least one of the PROGs 60C, 62C and 64C is assumed to include program instructions that, when executed by the associated DP, enable the electronic device to operate in accordance with the exemplary embodiments of this invention, as detailed above. Inherent in the DPs 60A, 62A, and 64A, as well as in the ASIC 62F, is a clock to enable synchronism among the 8-tuple parallel processing and with operations off the ASIC chip.

The PROGs 60C, 62C, 64C may be embodied in software, firmware and/or hardware, as is appropriate. In general, the exemplary embodiments of this invention may be implemented by computer software stored in the MEM 60B and executable by the DP 60A of the UE 60 and similar for the other MEM 62B and DP 62A of the Node B 62, or by hardware, or by a combination of software and/or firmware and hardware in any or all of the devices shown.

In general, the various embodiments of the UE 60 can include, but are not limited to, mobile stations, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The MEMs 60B, 62B and 64B may be of any type suitable to the local technical environment and may be implemented using any suitable data storage technology, such as semiconductor-based memory devices, magnetic memory devices and systems, optical memory devices and systems, fixed memory and removable memory. The DPs 60A, 62A and 64A may be of any type suitable to the local technical environment, and may include one or more of general purpose computers, special purpose computers, microprocessors, digital signal processors (DSPs) and processors based on a multi-core processor architecture, as non-limiting examples. The memory bank may be disposed in a memory of the ASIC 12F, the main memory 62B, or in any memory that may be gathered together or dispersed within the individual device 60, 62, 64.

Embodiments of this invention may be implemented by computer software executable by a data processor of the Node B 62, such as the processor 62A shown, or by hardware, or by a combination of software and hardware. Similarly, embodiments of this invention may be implemented by computer software executable by a data processor of the UE 60, such as the processor 60A shown, or by hardware, or by a combination of software and hardware. Further in this regard it should be noted that the various logical step descriptions above such as for FIG. 10 may represent program steps, or interconnected logic circuits, blocks and functions, or a combination of program steps and logic circuits, blocks and functions.

In general, the various embodiments may be implemented in hardware or special purpose circuits, software (computer readable instructions embodied on a computer readable medium), logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

Various modifications and adaptations may become apparent to those skilled in the relevant arts in view of the foregoing description, when read in conjunction with the accompanying drawings. However, any and all modifications of the teachings of this invention will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the ensuing claims.

I claim:

1. A method, comprising:
providing a memory bank comprised of a plurality of memories, a forward unit configured to apply logical memory addresses to the memory bank in a forward twofold access order, a backward unit configured to apply logical memory addresses to the memory bank in a backward twofold access order, and at least a half butterfly network disposed between the memory bank and the forward unit and the backward unit; and
generating a set of control signals and applying the generated set of control signals to the at least half butterfly network so as to access the memory bank with an n-tuple parallelism in a selected one of a linear order and a quadratic polynomial order for any n-tuple of the logical addresses without memory access conflict, wherein n is a non-zero integer power of two.

2. The method of claim 1, wherein barrel shifters are disposed with the at least half butterfly network between the memory bank and the forward unit and the backward unit; the method comprising generating the set of control signals and applying the generated set of control signals to the at least half butterfly network and to the barrel shifters so as to access the memory bank with the n-tuple parallelism.

3. The method of claim 2, wherein generating the set of control signals to the at least half butterfly network and to the barrel shifters so as to access the memory bank comprises applying second order differences to generate physical addresses to access the memory bank with the n-tuple parallelism.

4. The method of claim 1, further comprising pairing the logical addresses such that two logical addresses Add0 and Add1 are pairs if Add0=Add1 modulo (n/2).

5. The method of claim 4, where each paired logical addresses comprise a first logical address at the forward unit and a second logical address at the backward unit.

6. The method of claim 4 wherein applying the generated set of control signals comprises routing each of the paired logical addresses through a switch of the at least half butterfly network such that each of the switches has routed through only one pair of the logical addresses.

7. The method of claim 1, further comprising pairing the logical addresses such that any two memories sharing a crossbar switch of the at least half butterfly network are a pair of memories.

8. The method of claim 1 for controlling memory access during data decoding by a turbo decoder, wherein at least four buses couple the turbo decoder to the forward unit and at least four buses couple the turbo decoder to the backward unit so as to decode at least four trellis columns per data access of the memory bank.

9. The method of claim 1, wherein the set of control signals comprise least significant bits of physical addresses of the memories of the memory bank.

10. The method of claim 9, wherein a part of the set of control bits are generated from coefficients of a quadratic polynomial.

11. The method of claim 1, wherein:
the forward unit is configured to access the memories in the linear access order $4k, 4k+1, 4k+2, 4k+3$;
the backward unit is configured to access the memories in the linear access order $N-4(k+1), N-4(k+1)+1, N-4(k+1)+2, N-4(k+1)+3$;
and the at least half butterfly network is configured to access the memories in the 8-tuple linear access order $4k, 4k+1, 4k+2, 4k+3, N-4(k+1), N-4(k+1)+1, N-4(k+1)+2, N-4(k+1)+3$;
where k is an integer index $k=0, 1, 2, 1 \ldots, N/4-1$, and N is a length of a turbo interleaver and equal to an integer multiple of eight.

12. The method of claim 1, wherein:
the forward unit is configured to access the memories in the quadratic polynomial order $T(4k), T(4k+1), T(4k+2), T(4k+3)$;
the backward unit is configured to access the memories in the quadratic polynomial order $T(N-4(k+1)), T(N-4(k+1)+1), T(N-4(k+1)+2), T(N-4(k+1)+3)$;
and the at least half butterfly network is configured to access the memories in the 8-tuple quadratic polynomial order $T(4k), T(4k+1), T(4k+2), T(4k+3), T(N-4(k+1)), T(N-4(k+1)+1), T(N-4(k+2)+2), T(N-4(k+1)+3)$;
where k is an integer index $k=0, 1, 2, 1 \ldots, N/4-1$, and N is a length of a turbo interleaver and equal to an integer multiple of eight.

13. The method of claim 1, wherein generating the set of control signals to the at least half butterfly network so as to access the memory bank comprises applying second order differences to generate physical addresses for the memories for the n-tuple parallelism access of the memory bank.

14. The method of claim 13, wherein:
the second order differences comprise D0, D1 and D2, and are calculated from logical address values $g_k$, $g_{k+1}$, and $g_{k+2}$ such that:
D0 equals $g_k$;
D1 equals $g_{k+1}-g_k$ modulo an interleaver length; and
D2 equals $g_{k+2}-g_{k+1}-D1$ modulo the interleaver length; and
D0 and D1 are recursively updated such that D0 equals D0+D1 modulo the interleaver length and D1 equals D1+D2 modulo the interleaver length.

15. The method of claim 13, wherein one term of the second order differences is common for n-tuple of physical address generators.

16. An apparatus comprising:
a memory bank comprised of a plurality of memories;
a forward unit configured to apply logical memory addresses to the memory bank in a forward twofold access order;
a backward unit configured to apply logical memory addresses to the memory bank in a backward twofold access order;
at least a half butterfly network disposed between the memory bank and the forward unit and the backward unit;
a processor configured to generate a set of control signals and to apply the generated set of control signals to the at least half butterfly network so as to access the memory bank with an n-tuple parallelism in a selected one of a linear order and a quadratic polynomial order for any n-tuple of the logical addresses without memory access conflict, where n is a non-zero integer power of two; and
a decoder configured to decode received data using values extracted from the memory bank using the n-tuple parallelism.

17. The apparatus of claim 16, wherein for the case where n is a non-zero integer multiple of eight, the apparatus further comprises barrel shifters disposed with the at least half butterfly network between the memory bank and the forward unit and the backward unit, and the processor is configured to generate the set of control signals and to apply the generated set of control signals to the at least half butterfly network and to the barrel shifters so as to access the memory bank with the n-tuple parallelism.

18. The apparatus of claim 17, wherein the processor is configured to generate the set of control signals to the at least half butterfly network and to the barrel shifters so as to access the memory bank by applying second order differences and resetting the second order differences according to values of a quadratic polynomial permutation to generate physical addresses for the memories for the n-tuple parallelism access of the memory bank.

19. The apparatus of claim 16, wherein the processor is configured to generate the set of control signals to the at least half butterfly network by pairing the logical addresses such that any two logical addresses Add0 and Add1 are pairs if Add0=Add1 modulo (n/2).

20. The apparatus of claim 19, wherein each paired logical addresses comprises a first logical address at the forward unit and a second logical address at the backward unit.

21. The apparatus of claim 19, wherein the generated set of control signals route each of the paired logical addresses through a switch of the at least half butterfly network such that each of the switches has routed through it only one pair of the logical addresses.

22. The apparatus of claim 16, wherein the processor is configured to pair the logical addresses such that any two memories sharing a crossbar switch of the at least half butterfly network are a pair of memories.

23. The apparatus of claim 16, further comprising a turbo decoder coupled via at least four buses to the forward unit and coupled via at least four buses to the backward unit, and arranged so as to decode at least four trellis columns per data access of the memory bank.

24. The apparatus of claim 16, wherein the set of control signals comprise least significant bits of physical addresses of the memories of the memory bank.

25. The apparatus of claim 24, wherein processor is configured to generate the set of control bits from coefficients of a quadratic polynomial.

26. The apparatus of claim 16, wherein:
the forward unit is configured to access the memories in the linear access order 4k, 4k+1, 4k+2, 4k+3;
the backward unit is configured to access the memories in the linear access order N−4(k+1), N−4(k+1)+1, N−4(k+2)+2, N−4(k+1)+3;
and the at least half butterfly network is configured to access the memories in the 8-tuple linear access order 4k, 4k+1, 4k+2, 4k+3, N−4(k+1), N−4(k+1)+1, N−4(k+1)+2, N−4(k+1)+3;
where k is an integer index k=0, 1, 2, 1 . . . , N/4−1, and N is a length of a turbo interleaver and equal to n which is a non-zero integer multiple of eight.

27. The apparatus of claim 16, wherein:
the forward unit is configured to access the memories in the quadratic polynomial order T(4k), T(4k+1), T(4k+2), T(4k+3);
the backward unit is configured to access the memories in the quadratic polynomial order T(N−4(k+1)), T(N−4(k+1)+1), T(N−4(k+1)+2), T(N−4(k+1)+3);
and the at least half butterfly network is configured to access the memories in the 8-tuple quadratic polynomial order T(4k), T(4k+1), T(4k+2), T(4k+3), T(N−4(k+1)), T(N−4(k+1)+1), T(N−4(k+2)+2), T(N−4(k+1)+3);
where k is an integer index k=0, 1, 2, 1 . . . , N/4-1, and N is a length of a turbo interleaver and equal to n which is a non-zero integer multiple of eight.

28. The apparatus of claim 16, wherein the processor is configured to generate the set of control signals by applying second order differences and to reset the second order differences according to values of a quadratic polynomial permutation to generate physical addresses for the memories for the n-tuple parallelism access of the memory bank.

29. The apparatus of claim 28, wherein:
the processor is configured to calculate the second order differences from logical address values $g_k$, and $g_{k+2}$ such that:
D0 equals $g_k$;
D1 equals $g_{k+1}-g_k$ modulo an interleaver length; and
D2 equals $g_{k+2}-g_{k+1}-D1$ modulo the interleaver length; and
D0 and D1 are recursively updated such that D0 equals D0+D1 modulo the interleaver length and D1 equals D1+D2 modulo the interleaver length.

30. The apparatus of claim 28, wherein one term of the second order differences is common for n-tuple of physical address generators for n.

31. A program of machine-readable instructions, embodied on a tangible memory and executable by a digital data processor, to perform actions directed toward controlling memory access, the actions comprising:
- generating a set of control signals and applying the generated set of control signals to at least a half butterfly network that are disposed between a memory bank comprised of a plurality of memories and a bank of logical memory address ports so as to access the memory bank with an n-tuple parallelism in a selected one of a linear order and a quadratic polynomial order for any n-tuple of the logical addresses without memory access conflict, where n is a non-zero integer power of two; and
- decoding received data using values extracted from the memory bank using the n-tuple parallelism.

32. An apparatus comprising:
- storage means comprising extrinsic storage locations;
- logical address means for apply logical memory addresses to the memory bank in a forward twofold access order and in a backward twofold access order;
- at least switching means disposed between the storage means and the logical address means for selectively coupling individual logical address nodes to individual extrinsic storage locations;
- computing means for generating a set of control signals and applying the generated set of control signals to the switching means so as to access the storage means with an n-tuple parallelism in a selected one of a linear order and a quadratic polynomial order for any n-tuple of the logical address nodes without conflict among the extrinsic storage locations, where n is a non-zero integer power of two; and
- decoding means for decoding data using values extracted from the storage means using the n-tuple parallelism.

33. The apparatus of claim 32, wherein:
- the storage means comprises a memory bank of addressed memory locations;
- the logical address means comprises an address generator unit associated with the memory bank;
- the switching means comprises at least a half butterfly network, and for the case where n is a non-zero integer multiple of eight the switching means further comprises barrel shifters;
- the computing means comprises a processor disposed on an application specific integrated circuit; and
- the decoding means comprises a turbo decoder.

\* \* \* \* \*